(12) United States Patent
Hébert et al.

(10) Patent No.: US 9,214,544 B2
(45) Date of Patent: Dec. 15, 2015

(54) SOURCE AND BODY CONTACT STRUCTURE FOR TRENCH-DMOS DEVICES USING POLYSILICON

(71) Applicant: Alpha & Omega Semiconductor, LTD, Hamilton (BM)

(72) Inventors: François Hébert, San Mateo, CA (US); Anup Bhalla, Santa Clara, CA (US)

(73) Assignee: Alpha and Omega Semiconductor Incorporated, Sunnyvale, CA (US)

( * ) Notice: Subject to any disclaimer, the term of this patent is extended or adjusted under 35 U.S.C. 154(b) by 55 days.

(21) Appl. No.: 14/256,843

(22) Filed: Apr. 18, 2014

(65) Prior Publication Data

US 2014/0225188 A1     Aug. 14, 2014

Related U.S. Application Data

(60) Division of application No. 13/559,490, filed on Jul. 26, 2012, now Pat. No. 8,703,563, which is a continuation-in-part of application No. 12/060,096, filed on Mar. 31, 2008, now abandoned.

(51) Int. Cl.
*H01L 29/78* (2006.01)
*H01L 29/417* (2006.01)
(Continued)

(52) U.S. Cl.
CPC ...... *H01L 29/7813* (2013.01); *H01L 29/41766* (2013.01); *H01L 29/66727* (2013.01); *H01L 29/66734* (2013.01); *H01L 29/086* (2013.01); *H01L 29/0869* (2013.01); *H01L 29/42368* (2013.01); *H01L 29/456* (2013.01)

(58) Field of Classification Search
CPC ............ H01L 29/4236; H01L 29/7813; H01L 29/66712; H01L 29/66719; H01L 29/66727; H01L 29/66734
See application file for complete search history.

(56) References Cited

U.S. PATENT DOCUMENTS 5,378,655 A   1/1995  Hutchings et al.
5,378,665 A   1/1995  Chen et al.
(Continued)

FOREIGN PATENT DOCUMENTS

CN        1589499 A    3/2005

OTHER PUBLICATIONS

Advisory Action mailed date Jun. 22, 2011, issued for U.S. Appl. No. 12/060,096.
(Continued)

*Primary Examiner* — Whitney T Moore
*Assistant Examiner* — Scott Stowe
(74) *Attorney, Agent, or Firm* — Joshua D. Isenberg; JDI Patent

(57) ABSTRACT

A semiconductor device includes a gate electrode, a top source region disposed next to the gate electrode, a drain region disposed below the bottom of the gate electrode, a oxide disposed on top of the source region and the gate electrode, and a doped polysilicon spacer disposed along a sidewall of the source region and a sidewall of the oxide. Methods for manufacturing such device are also disclosed. It is emphasized that this abstract is provided to comply with the rules requiring an abstract that will allow a searcher or other reader to quickly ascertain the subject matter of the technical disclosure. It is submitted with the understanding that it will not be used to interpret or limit the scope or meaning of the claims.

4 Claims, 20 Drawing Sheets

(51) Int. Cl.
   *H01L 29/66*   (2006.01)
   *H01L 29/08*   (2006.01)
   *H01L 29/423*   (2006.01)
   *H01L 29/45*   (2006.01)

(56)   References Cited

U.S. PATENT DOCUMENTS

| 5,567,634 | A  | 10/1996 | Hebert et al. |
| 5,665,619 | A  | 9/1997  | Kwan et al. |
| 5,684,319 | A  | 11/1997 | Hebert |
| 5,930,630 | A  | 7/1999  | Hshieh et al. |
| 6,251,730 | B1 | 6/2001  | Luo |
| 6,384,450 | B1 | 5/2002  | Hidaka et al. |
| 6,849,899 | B2 | 2/2005  | Hshieh et al. |
| 6,924,198 | B2 | 8/2005  | Williams et al. |
| 8,703,563 | B2 | 4/2014  | Hebert et al. |
| 2005/0062075 | A1 | 3/2005 | Hshieh et al. |
| 2006/0071268 | A1 | 4/2006 | Tai et al. |
| 2007/0032020 | A1 | 2/2007 | Grebs et al. |
| 2007/0037327 | A1 | 2/2007 | Herrick et al. |
| 2009/0242973 | A1 | 10/2009 | Hebert et al. |

OTHER PUBLICATIONS

Advisory Action mailed date Jun. 8, 2012, issued for U.S. Appl. No. 12/060,096.
Final Office Action mailed date Apr. 12, 2011, issued for U.S. Appl. No. 12/060,096.
Non- Final Office Action mailed date Nov. 4, 2010, issued for U.S. Appl. No. 12/060,096.
Non- Final Office Action mailed date Oct. 12, 2011, issued for U.S. Appl. No. 12/060,096.
Office Action dated Aug. 4, 2010 for Chinese Patent application No. 200910133207.5 and its English Summary.

SOURCE AND BODY CONTACT STRUCTURE FOR TRENCH-DMOS DEVICES USING POLYSILICON

PRIORITY CLAIM

This application is a divisional of and claims the priority benefit of U.S. patent application Ser. No. 12/060,096, filed Mar. 31, 2008, the entire contents of which are incorporated herein by reference.

This application is a divisional of and claims the priority benefit of co-pending U.S. patent application Ser. No. 13/559,490, filed Jul. 26, 2012, the entire contents of which are incorporated herein by reference.

FIELD OF THE INVENTION

This invention generally relates to vertical power MOSFET devices and more particularly to power MOSFET devices having improved source and body contact structure for highest-performance.

BACKGROUND OF THE INVENTION

Conventionally, a power metal oxide silicon field effect transistor (power MOSFET) is used to provide high voltage circuits for power integrated circuit applications. Various internal parasitic components often impose design and performance limitations on a conventional power MOSFET. Among these parasitic components in a MOSFET transistor, special care must be taken in dealing with a parasitic npn bipolar junction transistor (BJT) formed between the source, the body, and the drain of a MOSFET device. The parasitic current, which flows from the source to the drain and through the body as opposed to a channel, tends to run away, i.e., the more current, the more the bipolar action turns on. For the purpose of reducing parasitic bipolar structure action and improving the device ruggedness, the base resistance of the body or drain to source on-resistance ($Ra_{ds-on}$) needs to be minimized. Standard solution is to dope the body as much as possible to reduce base resistance, which reduces current gain of bipolar and forces to push more parasitic current before bipolar turns on since base-emitter voltage $V_{BE}$ is a function of resistance:

$$V_{BE}=I_{parasitic} \times R_{base-local}$$

For typical BJT devices, $V_{BE}$ is about 0.5V to 0.6V to turn on the bipolar action.

U.S. Pat. No. 5,930,630 discloses a butted trench-contact MOSFET cell structure having a self aligned deep and shallow high-concentration body-dopant regions. A top portion of a lightly doped source region is removed to reduce contact resistance. However, horizontal butted contacts require a lot of space which adversely impacts both cell density and $R_{ds-on}$. In addition, the trench-contacts can have a high source resistance since a small portion of the N+ source (for NMOS) is contacted by the source metal. Also, for the trench-contact, if the Boron (for NMOS) body contact implant at the bottom of the trench is not vertical, there can be compensation of the N+ source (for NMOS) which results in excessive $R_{ds-on}$ because of increased source resistance.

U.S. Pat. No. 5,684,319 discloses a DMOS device structure, and method of manufacturing the same features a self-aligned source and body contact structure which requires no additional masks. N+ polysilicon spacers are used to form the source region at the periphery of the gate polysilicon. However, the N+ polysilicon source only improves the source contact, which lowers the resistance, but it has no effect on body region.

It would be desirable to develop a structure which achieves self-aligned source/body contact without using mask, highly rugged and robust structure with low-resistance source and body contact. It would be further desirable to develop a structure which achieves low-thermal budget to realize shallow junctions, compatible with stripe and closed-cell geometries, compatible with standard foundry process, with standard metallization schemes to achieve low contact resistivity, compatible with ultra-small cell-pitch. It would be further desirable to produce a device with a low-cost of manufacture.

It is within this context that embodiments of the present invention arise.

BRIEF DESCRIPTION OF THE DRAWINGS

Objects and advantages of the invention will become apparent upon reading the following detailed description and upon reference to the accompanying drawings in which.

DESCRIPTION OF THE SPECIFIC EMBODIMENTS

Although the following detailed description contains many specific details for the purposes of illustration, anyone of ordinary skill in the art will appreciate that many variations and alterations to the following details are within the scope of the invention. Accordingly, the exemplary embodiments of the invention described below are set forth without any loss of generality to, and without imposing limitations upon, the claimed invention.

Figure 1A:
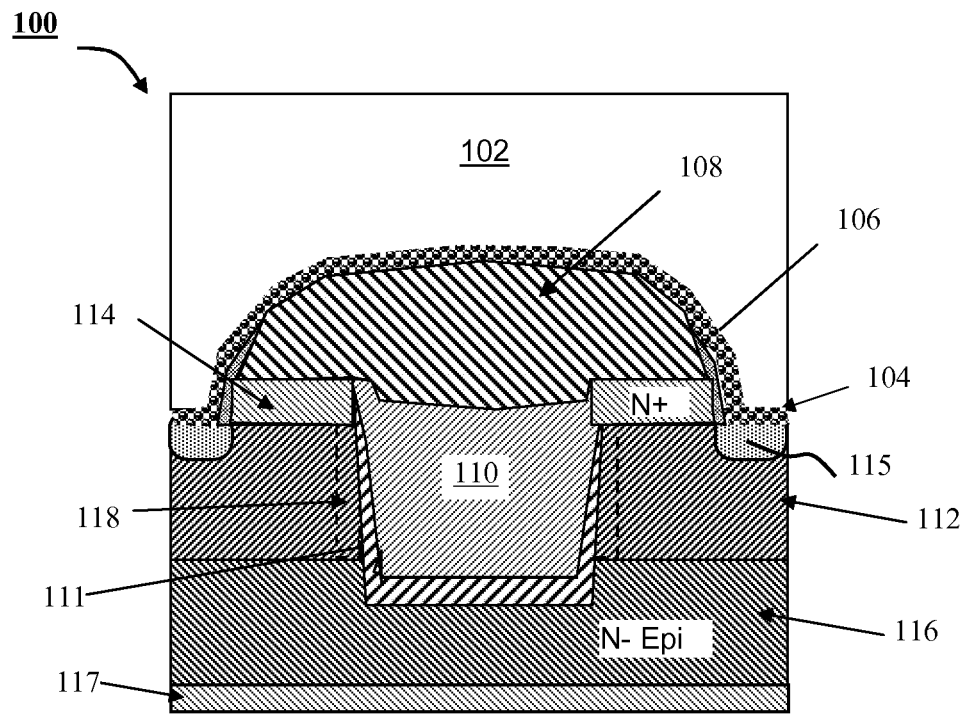
FIGS. 1A-1E are cross-sectional views of MOSFETs according to an embodiment of the present invention.

FIG. 1A is a cross-sectional view of a trench MOSFET 100 according to an embodiment of the present invention. The trench MOSFET 100 includes a P-body layer 112 formed on an N-epitaxial (epi) layer 116, a N+ poly trenched gate 110 formed in a trench in the P-body layer 112 and the N-epi layer 116, a top N+ source region 114 disposed on the P-body layer 112 next to the trenched gate 110, and a drain region formed by a substrate 117 disposed below the bottom of the trenched gate 110 and below the P-body layer 112. The trench MOSFET 100 also includes a gate oxide 111 disposed between the trenched gate 110 and the top N+ source region 114, P-body layer 112 and the N-epi layer 116. A reflowed oxide 108 is disposed on top of the N+ source region 114 and the trenched gate 110. A doped N+ polysilicon spacer 106 is disposed along a sidewall of the source region 114 and a sidewall of the reflowed oxide 108. The trench MOSFET 100 may further include a barrier metal 104 disposed on top of the P-body layer, the doped N+ polysilicon spacer 106 and the reflowed oxide 108 and a reflowed source metal 102 to fill contacts.

The N+ doped polysilicon spacer 106 increases N+ source contact area at the sidewall of the top N+ source region 114 and spaces a heavily P-type implanted contact region 115 formed in the P-body layer 112 away from the top N+ source region 114, and hence away from a channel region 118 formed on the sidewalls of the gate trenches in the body layer 112, to minimize any impact on the threshold voltage of the transistor.

The heavily implanted contact region 115 may be formed, e.g., using a shallow implant of the same conductivity type as the body layer 112, The implant may be done after etching the poly-Si spacers 106 and before metallization. The contact region 115 helps to reduce the body contact resistance. The benefits of spacing the heavily doped P+ body contact region 115 away from the source 114 is really to space the P+ body contact region 115 away from the channel region 118, to ensure that the extra doping does not get close to trench sidewall regions. Any dopant diffusion which reaches the trench sidewall surfaces might result in an increase in the threshold voltage which is detrimental to the performance.

Figure 1B:
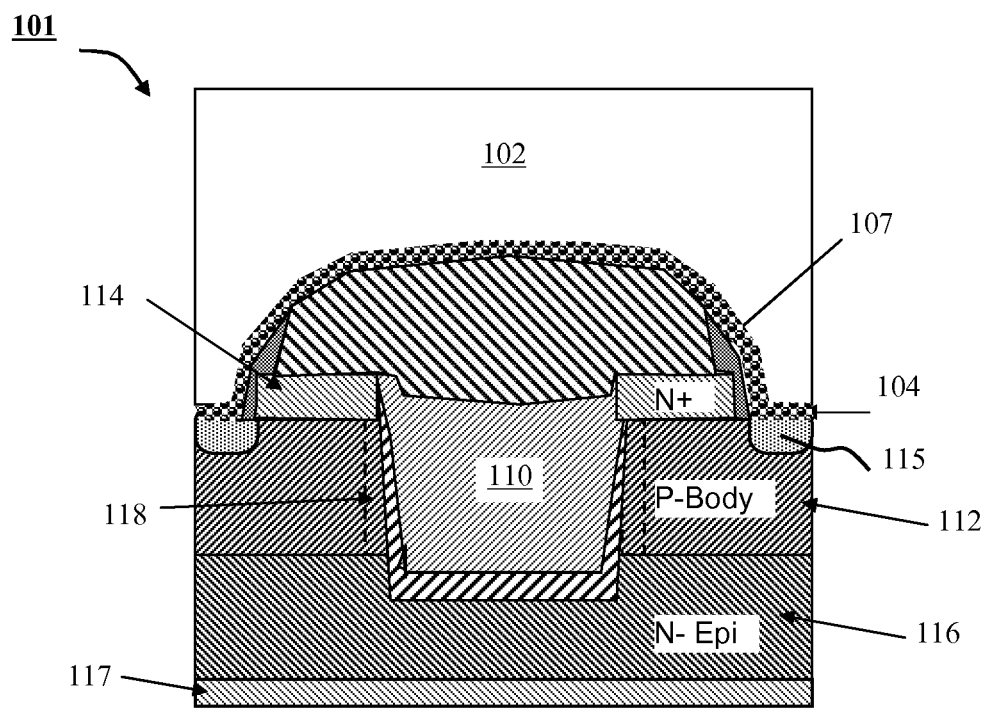

FIG. 1B is a cross-sectional of an alternative trench MOSFET 101, which has a similar structure as the trench MOSFET 100. As shown in FIG. 1B, the N+ polysilicon spacer 107 is formed on a shelf on a portion of a top surface of the source region 114 that is not covered by the oxide 108. This particular configuration of the N+ polysilicon spacer 107 further reduces contact resistance by exposing more of the source region 114 to contact with the spacer 107.

Figure 1C:
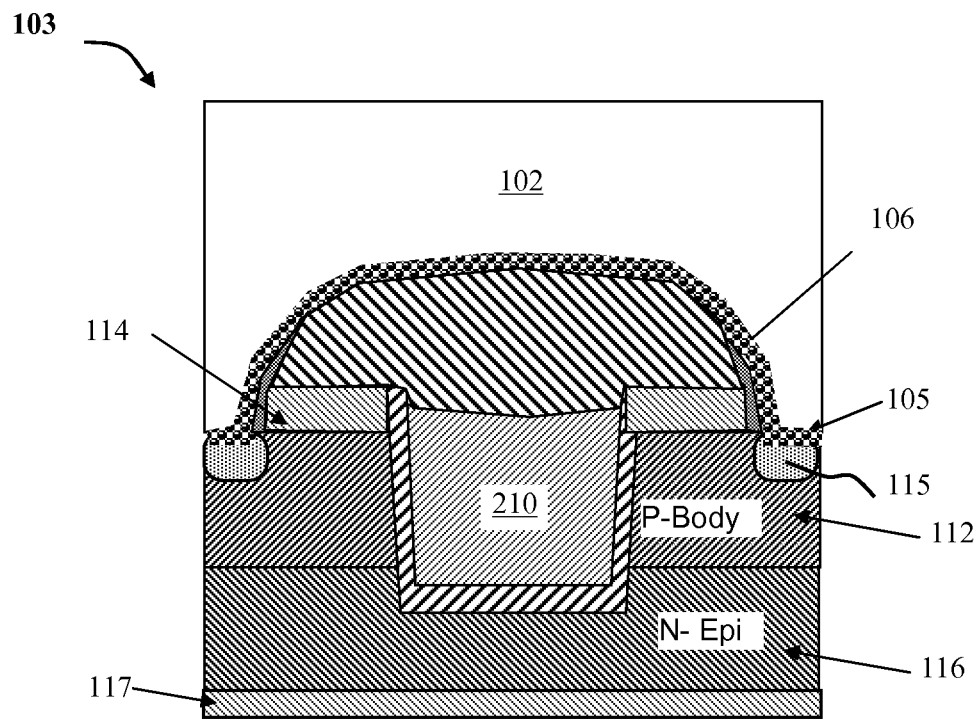

FIG. 1C is a cross-sectional of an alternative trench MOSFET 103, which has similar structure as the trench MOSFET 100. As shown in FIG. 1C, a portion of a top surface of the P-body layer 112, which is not underlying the source region 114, is recessed to a lower level than a portion of the top surface of the P-body layer 112 underlying the source region 114. Among the benefits of this configuration compared to the foregoing embodiments is that the body contact region 115 can be further recessed below the silicon surface, below the bottom of the source 114, which further reduces both body resistance and parasitic bipolar action.

Figure 1D:
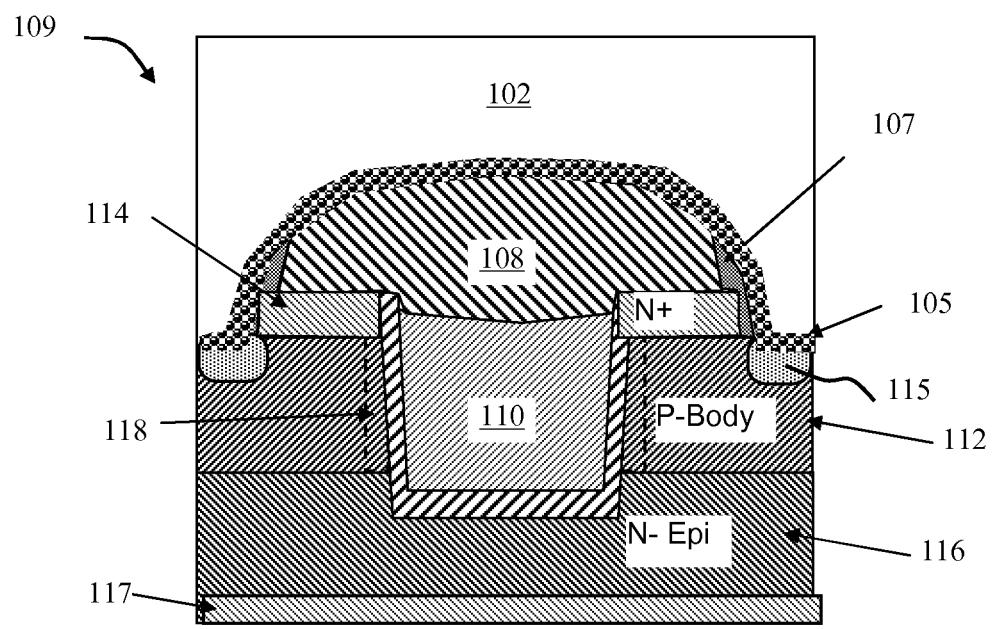

FIG. 1D is a cross-sectional of an alternative trench MOSFET 109, which is a combination of trench MOSFETs 101 and 103. As shown in FIG. 1D, the trench MOSFET 109 includes a N+ polysilicon spacer 107 is formed on a shelf on a portion of a top surface of the source region 114 that is not covered by the oxide 108 and a portion of a top surface of the P-body layer 112 that does not underlie the source region 114 is recessed to a lower level than a portion of the top surface of the P-body layer 112 underlying the source region 114. This configuration has the advantages of lower source resistance by increasing the amount of N+ silicon in contact with the N+ polysilicon sidewall extension, and further recessing of the Body contact region 115 below the silicon surface and below the source 114, to further reduce any parasitic bipolar action.

Figure 1E:
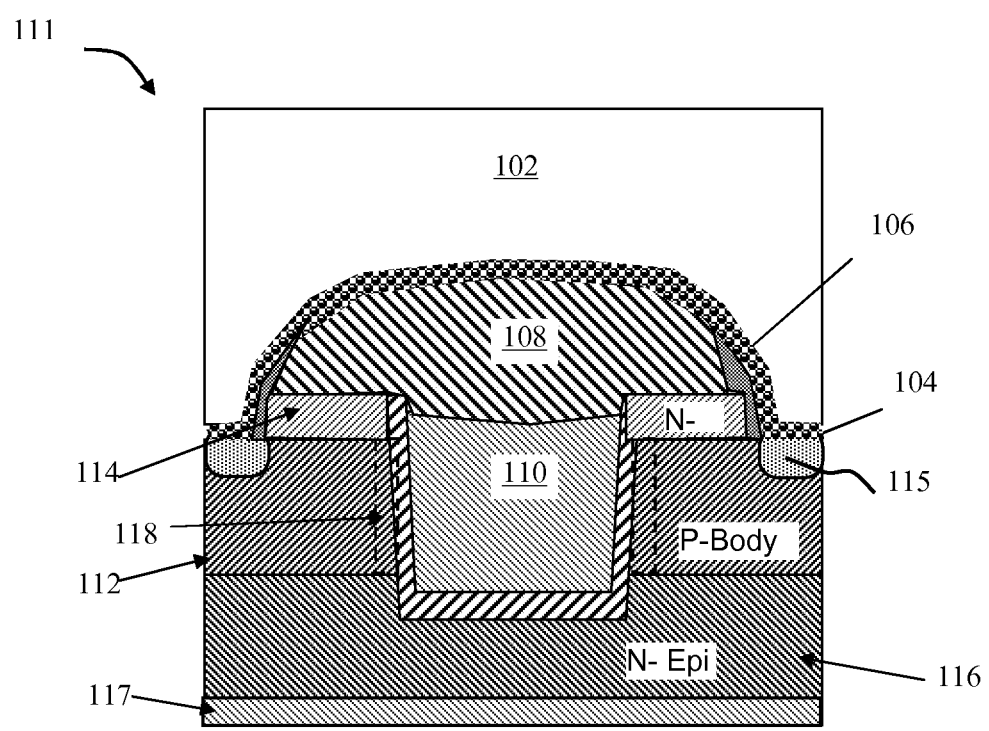

The N+ doped polysilicon spacer 107 allows different types of doping to be done in the top source region. FIG. 1E is a cross-sectional of an alternative trench MOSFET 111, which has a similar structure as the trench MOSFET 100. As shown in FIG. 1E, trench MOSFET 111 includes a P-body layer 112 formed on an N-epitaxial (epi) layer 116, a N+ poly trenched gate 110 formed in a trench in the P-body layer 112 and the N-epi layer 116, a top N− source region 114 disposed on the P-body layer 112 next to the trenched gate 110, and a drain region formed by a substrate 117 disposed below the bottom of the trenched gate 110 and below the P-body layer 112. The highly N+ doped polysilicon spacer 106 contacting the sidewall of the top low doped N− source region 114 adds small resistance to control gain of the circuit to give more uniformity when the trench MOSFETs are connected in parallel.

Figure 2A:
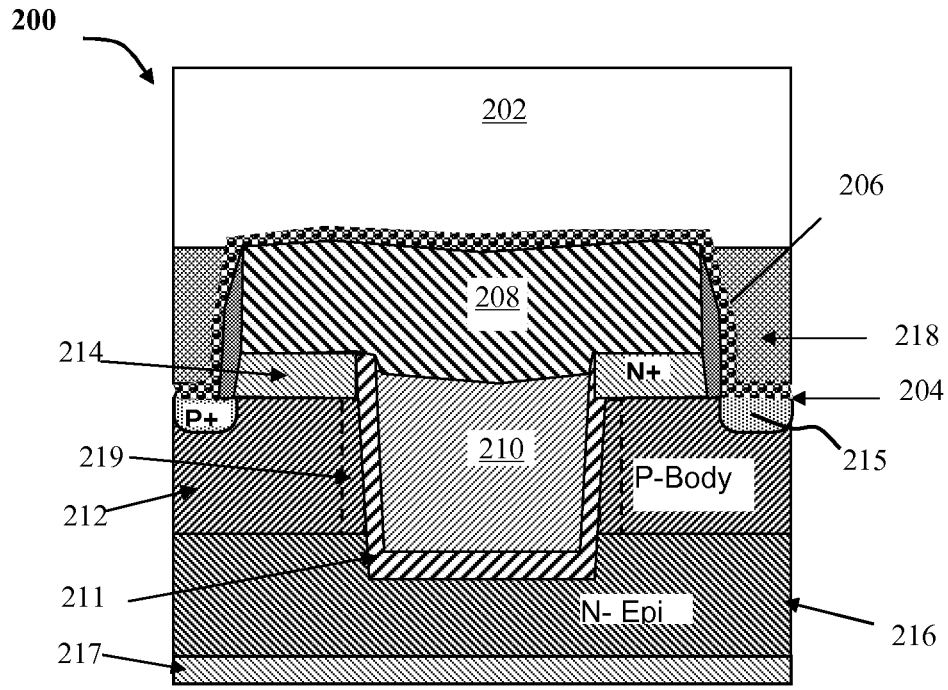
FIGS. 2A-2E are cross-sectional views of the alternative MOSFETs according to another embodiment of the present invention

FIG. 2A is a cross-sectional view of an N-channel trench MOSFET 200 according to another embodiment of the present invention. A P-Channel structure would be similar except for the conductivity type of the various doped regions (N become P and P become N, for a P-channel version). In this embodiment, the trench MOSFET 200 includes a P-body layer 212 formed on an N-epitaxial (epi) layer 216, a N+ polysilicon filled trenched gate 210 electrode formed in the P-body layer 212 and the N-epi layer 216, a top N+ source region 214 disposed on the P-body layer 212 next to the trenched gate 210, and a drain region formed by a substrate 217 disposed below the bottom of the trenched gate 210 and P-body layer 212. The trench MOSFET 200 also includes a gate oxide 211 disposed between the N+ doped Polysilicon of the trenched gate 210 and the top N+ source region 214, the P-body layer 212 and the N-epi layer 216, a vertically etched oxide 208 disposed on top of the N+ source region 214 and the trenched gate 210, and a doped N+ polysilicon spacer 206 disposed along the sidewall of the source region and a sidewall of the vertically etched oxide 208. The trench MOSFET 200 further includes a barrier metal 204 disposed on top of the doped N+ polysilicon spacer 206 and the vertically etched oxide 208, a Tungsten plug 218 adjacent to the barrier metal 204 and a source metal 202 disposed on top of the barrier metal 204 and the Tungsten plug 218.

A heavily P-type implanted contact region 215 may be formed in the P-body layer 212 proximate the spacer 206 and spaced away from the top N+ source region 214, and hence away from a channel region 219 formed on the sidewalls of the gate trenches in the body layer 212, to minimize any impact on the threshold voltage of the transistor by the body contact implant(s).

Figure 2B:
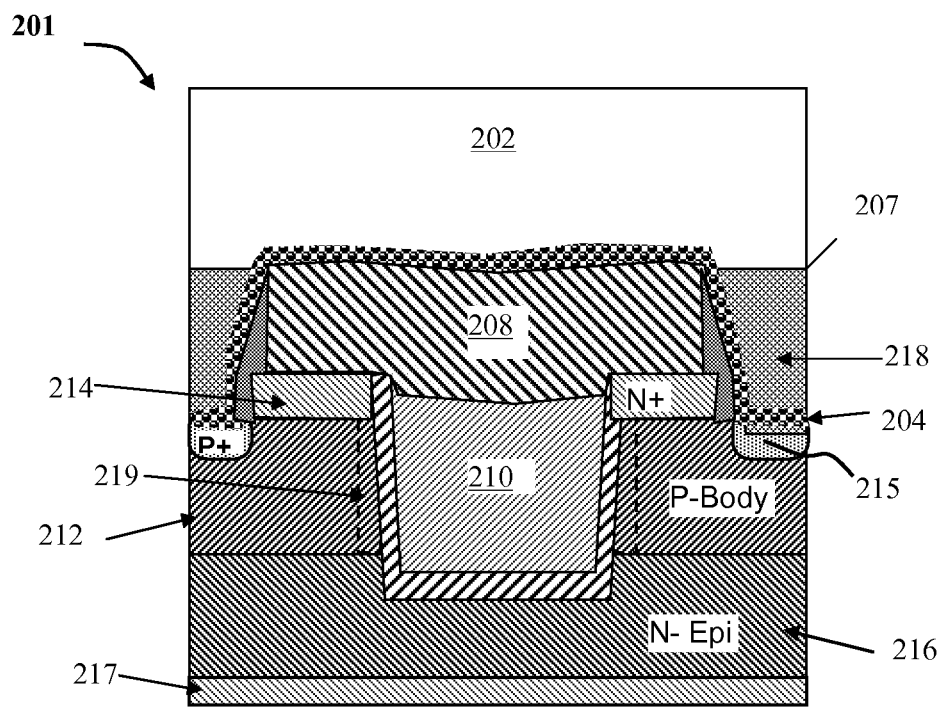

FIG. 2B is a cross-sectional of an alternative trench MOSFET 201, which has a similar structure as the trench MOSFET 200. As shown in FIG. 2B, the N+ polysilicon spacer 207 is formed on a shelf on a portion of a top surface of the source region 214 that is not cover by the oxide 208. The N+ polysilicon spacer 207 reduces more contact resistance by exposing more of the source region 214.

Figure 2C:
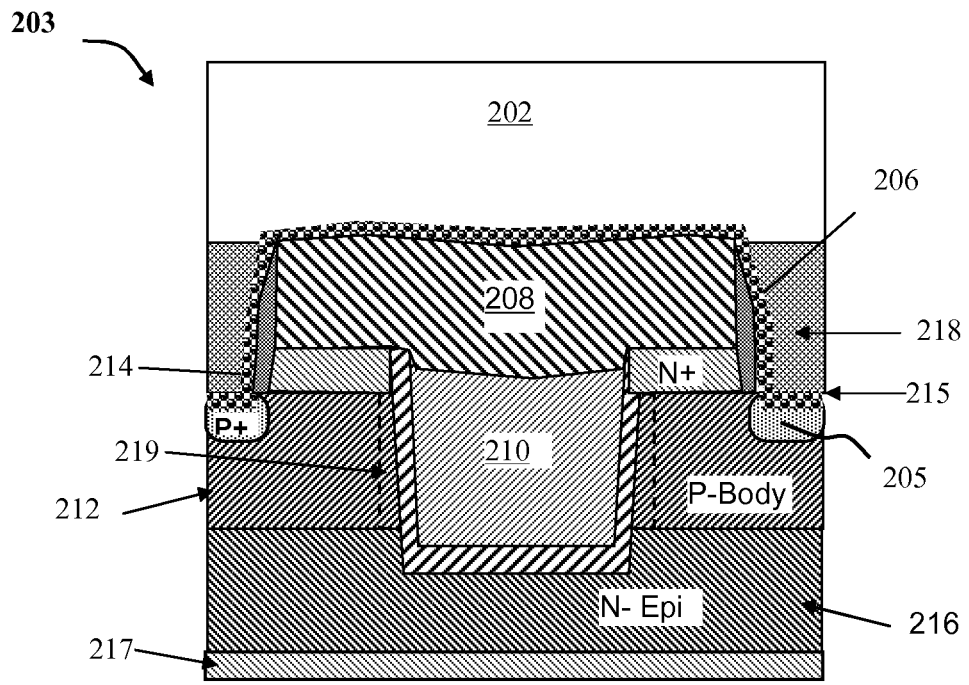

FIG. 2C is a cross-sectional of an alternative trench MOSFET 203, which has similar structure as the trench MOSFET 200. As shown in FIG. 2C, a portion of a top surface of the P-body layer 212, which is not underlying the source region 214, is recessed to a lower level than a portion of the top surface of the P-body layer 212 underlying the source region 214.

Figure 2D:
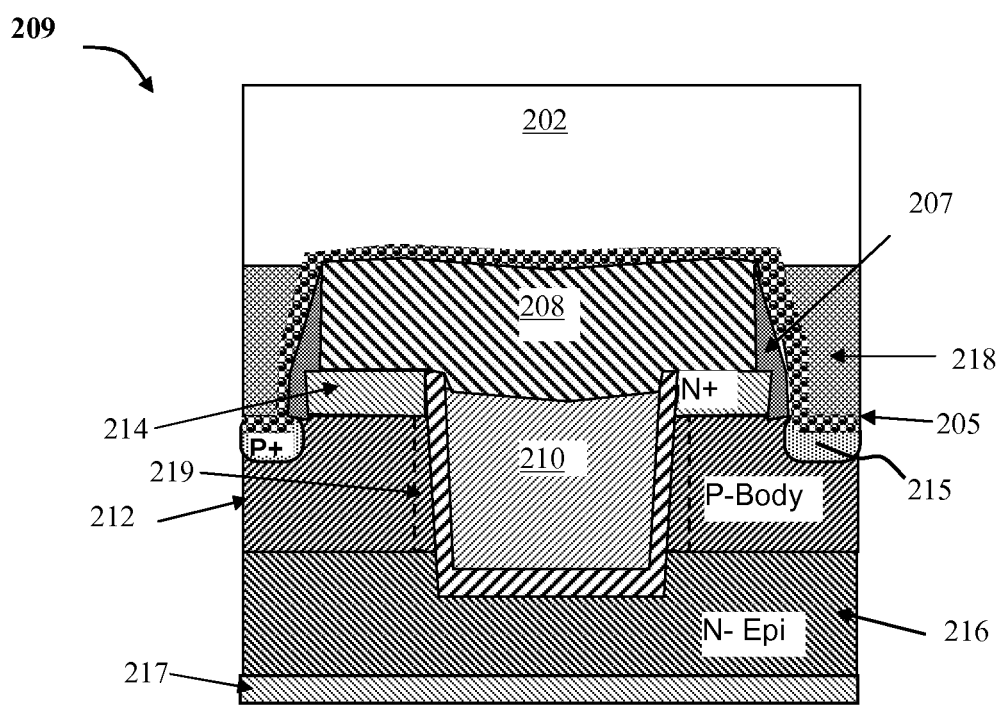

FIG. 2D is a cross-sectional of an alternative trench MOSFET 209, which is a combination of trench MOSFETs 201 and 203. As shown in FIG. 2D, the trench MOSFET 209 includes a N+ polysilicon spacer 207 is formed on a shelf on a portion of a top surface of the source region 214 that is not covered by the oxide 208 and a portion of a top surface of the P-body layer 212, which is not underlying the source region 214, is recessed to a lower level than a portion of the top surface of the P-body layer 212 underlying the source region 214.

Figure 2E:
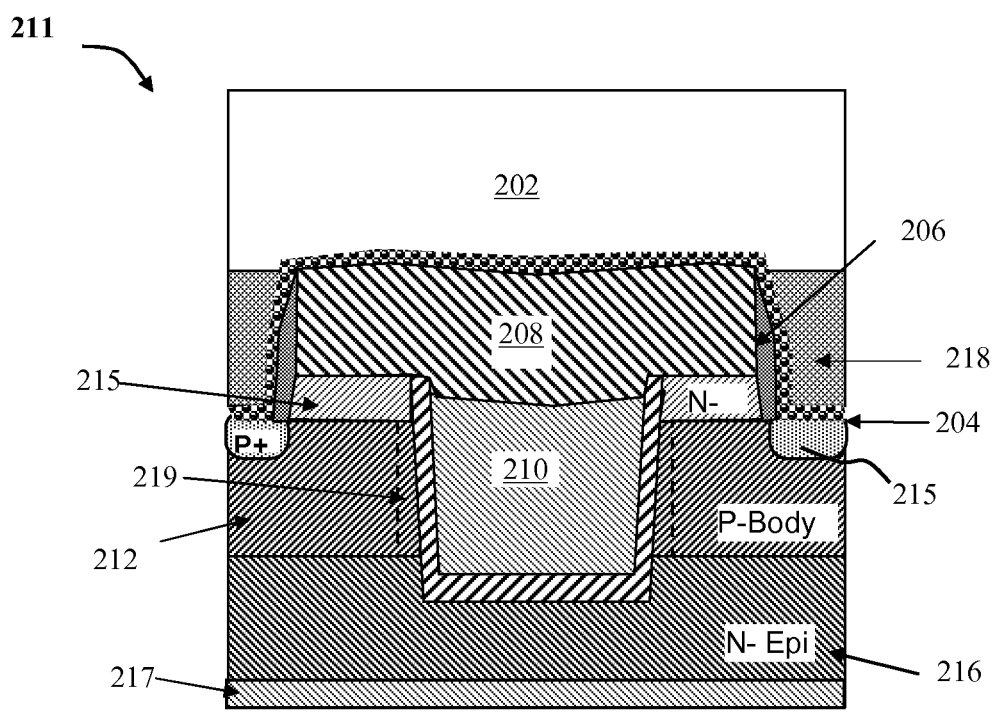

FIG. 2E is a cross-sectional of an alternative trench MOSFET 211, which has a similar structure as the trench MOSFET 200. As shown in FIG. 2E, trench MOSFET 211 includes a P-body layer 212 formed on an N-epitaxial (epi) layer 216, a N+ polysilicon filled trenched gate electrode 210 formed in the P-body layer 212 and the N-epi layer 216, a top N− source region 214 disposed on the P-body layer 212 next to the trenched gate 210, and a drain region formed by a substrate 217 disposed below the bottom of the trenched gate 210 and the P-body layer 212. The highly N+ doped polysilicon spacer 206 contacts a sidewall of a top low doped N− source region 214, which adds a small resistance to control gain of the circuit to give more uniformity when the trench MOSFETs are connected in parallel. This is referred to as source ballasting, and results in a more robust transistors in high-power applications.

Figure 3A:
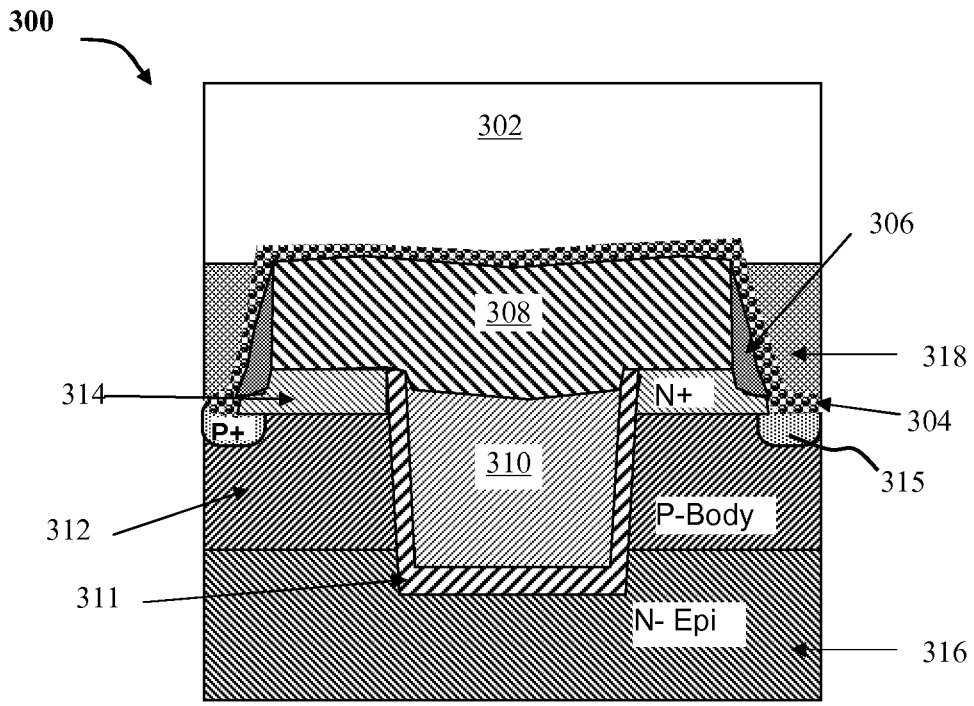
FIGS. 3A-3D are cross-sectional views of the alternative MOSFETs according to another embodiment of the present invention.

FIG. 3A is a cross-sectional view of a trench MOSFET 300 according to another embodiment of the present invention. The trench MOSFET 300 includes a P-body layer 312 formed on an N-epitaxial (epi) layer 316, a N+ polysilicon gate electrode 310 formed in a trench in the P-body layer 312 and the N-epi layer 316, a top N+ source region 314 disposed on the P-body layer 312 next to the trenched gate 310, and a drain region formed by a substrate 309 disposed below the bottom of the trenched gate 310 and the P-body layer 312. The trench MOSFET 300 also includes a gate oxide 311 disposed between the trenched gate 310 and the top N+ source region 314, P-body layer 312 and the N-epi layer 316. A vertically etched oxide 308 is disposed on top of the N+ source region 314 and the trenched gate 310, and a doped N+ polysilicon spacer 306 is disposed along the sidewall of the source region and a sidewall of the vertically etched oxide 308. The doped N+ polysilicon spacer 306 extends over a step formed in a top portion of the N+ source region 314.

A heavily P-type implanted contact region 315 may be formed in the P-body layer 312 proximate the spacer 306 and spaced away from the top N+ source region 314, and hence away from a channel region 319 formed on the sidewalls of the gate trenches in the body layer 312, to minimize any impact on the threshold voltage of the transistor.

The trench MOSFET 300 further includes a barrier metal 304 disposed on top of the doped N+ polysilicon spacer 306 and the vertically etched oxide 308, a Tungsten plug 318 adjacent to the barrier metal 304 and a source metal 302 disposed on top of the barrier metal 304 and the Tungsten plug 318.

A configuration of the type shown in FIG. 3A has the additional benefits that the contact between the N+ source silicon region 314 and the N+ doped Polysilicon spacer may be increased by forming a step in the N+ silicon source region 414, which can further reduce the source contact resistance. With a step, the N+ silicon source region 314 may be contacted on a horizontal plane as well as two vertical sidewalls. It should be noted that this "partial step" into the N+ source 314 may be achieved simply by controlling an amount of over-etch into the silicon of the source region during the contact etch step.

Figure 3B:
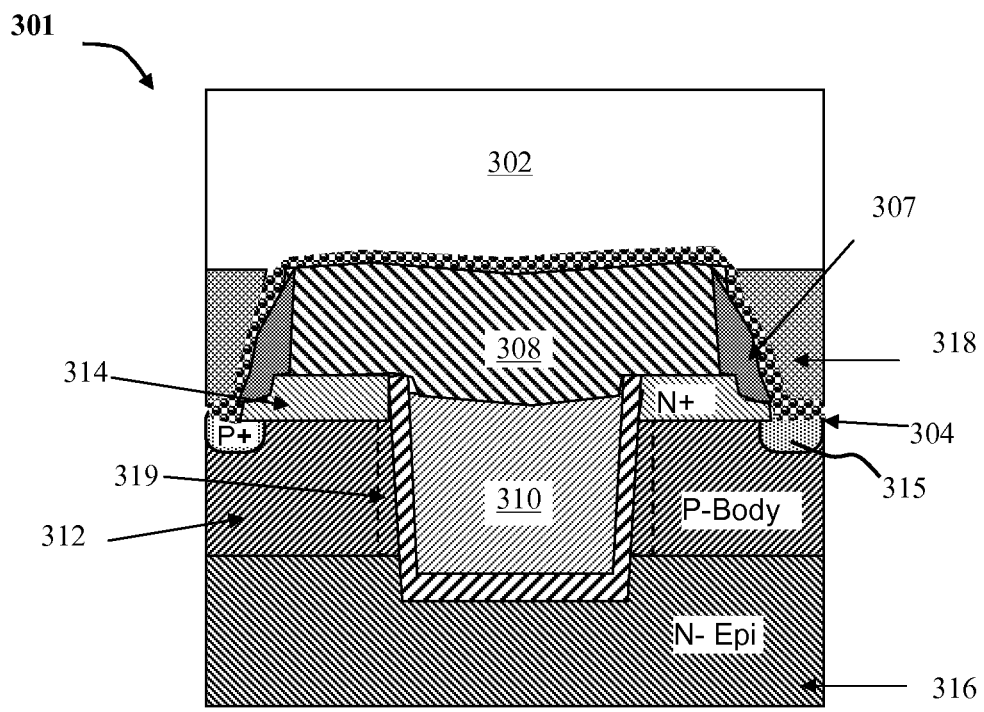

FIG. 3B is a cross-sectional of an alternative trench MOSFET 301, which has a similar structure as the trench MOSFET 300. As shown in FIG. 3B, the N+ polysilicon spacer 307 is formed on a shelf on a portion of a top surface of the source region 314 that is not covered by the oxide 308. The N+ polysilicon spacer 307 improves contact with the N+ source region 314.

Figure 3C:
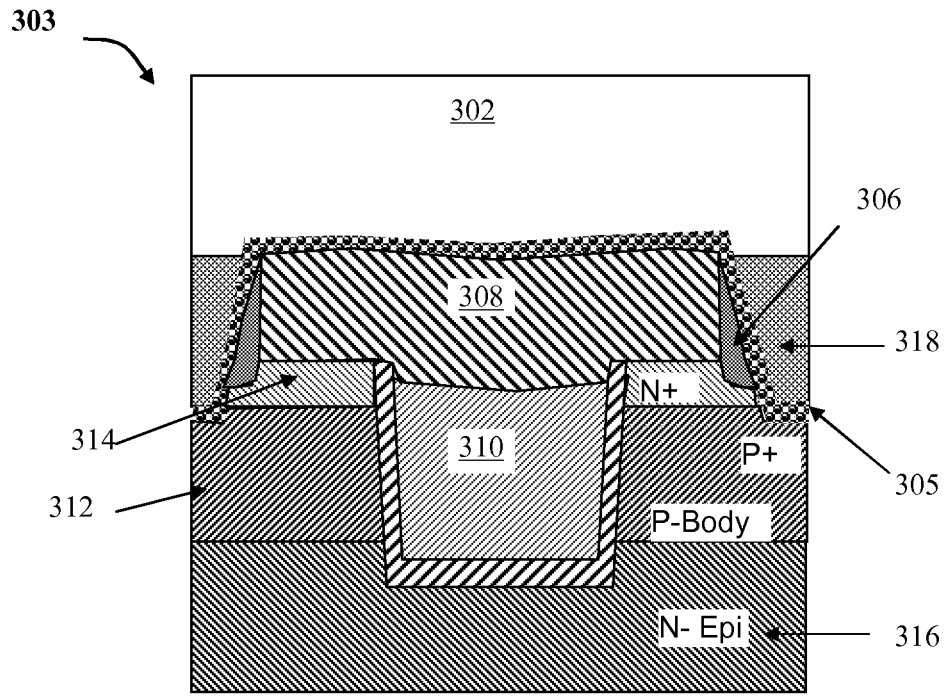

FIG. 3C is a cross-sectional of an alternative trench MOSFET 303, which has similar structure as the trench MOSFET 300. As shown in FIG. 3C, a portion of a top surface of the P-body layer 312 that does not underlie the source region 314 is recessed to a lower level than a portion of the top surface of the P-body layer 312 underlying the source region 314.

Figure 3D:
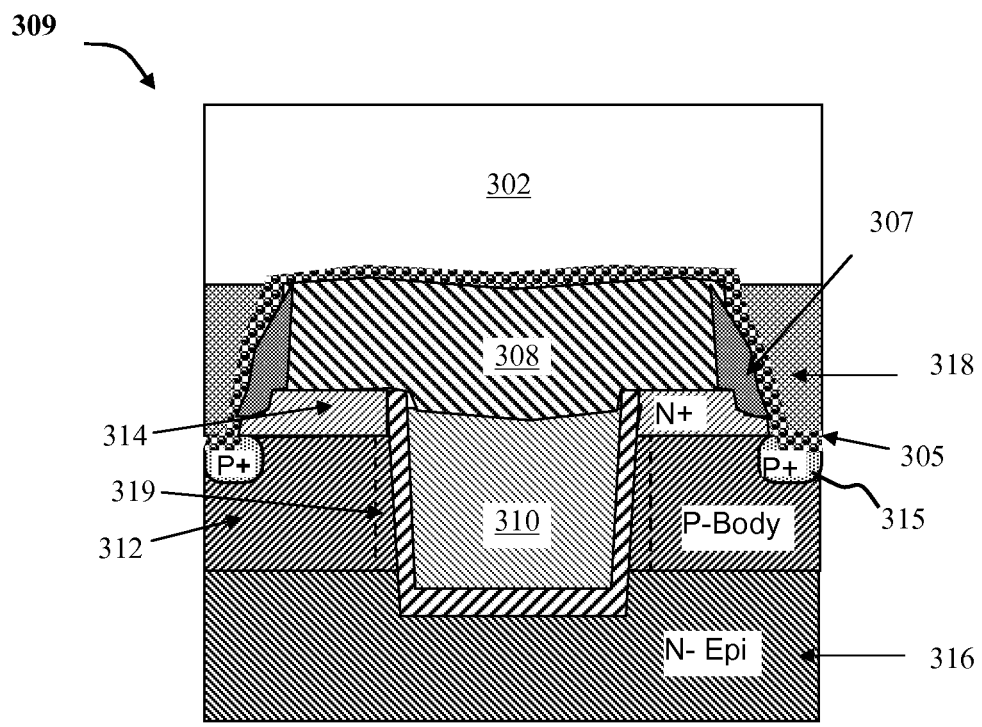

FIG. 3D is a cross-sectional of an alternative trench MOSFET 309, which is a combination of trench MOSFETs 301 and 303. As shown in FIG. 3D, the trench MOSFET 309 includes a N+ polysilicon spacer 307 is formed on a shelf on a portion of a top surface of the source region 314 that is not cover by the oxide 308. A portion of a top surface of the P-body layer 312 that does not underlie the source region 314 is recessed to a lower level than a portion of the top surface of the P-body layer 312 underlying the source region 314.

Figure 4A:
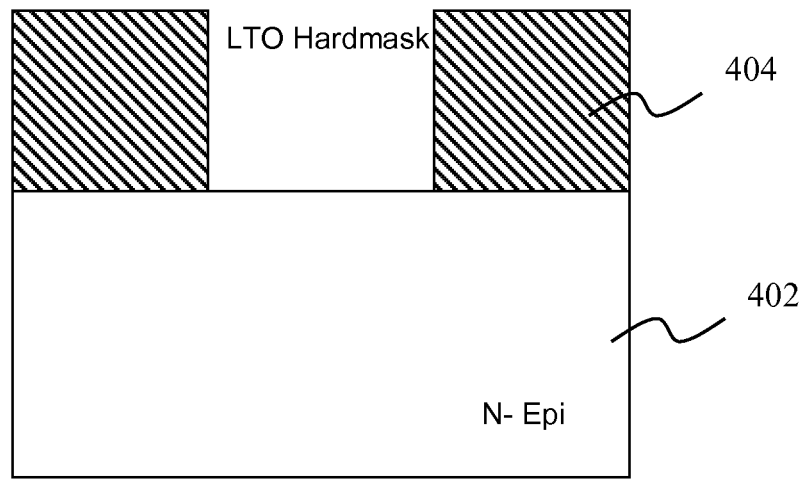
FIGS. 4A-4M are cross-sectional views illustrating a method for manufacturing the MOSFETs of the types depicted in FIGS. 1A-1B.

There are a number of different techniques for fabricating MOSFET devices of the types described above. By way of example, FIGS. 4A-4M are cross-sectional views illustrating a method of fabrication of trench MOSFET of the types depicted in FIGS. 1A-1B. As shown in FIG. 4A, an N-type epitaxial semiconductor layer 402 may be grown on a substrate 409 (typically highly doped N+ for an N-channel device). A trench mask 404 is then formed on a surface of the N-epi layer 402, e.g., by patterning a photoresist layer, or by patterning a hardmask oxide formed using a low temperature oxide (LTO) deposition technique or thermal oxidation, etched by a photoresist mask.

Figure 4B:
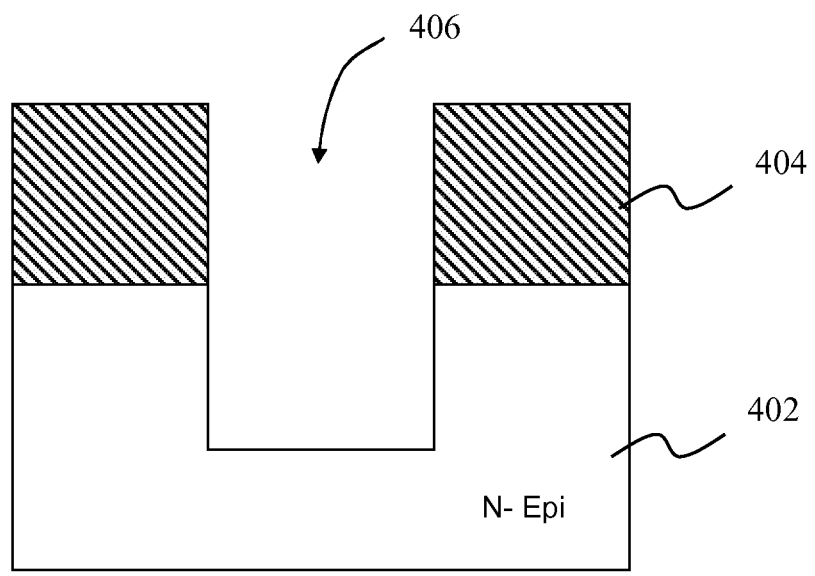
Figure 4C:
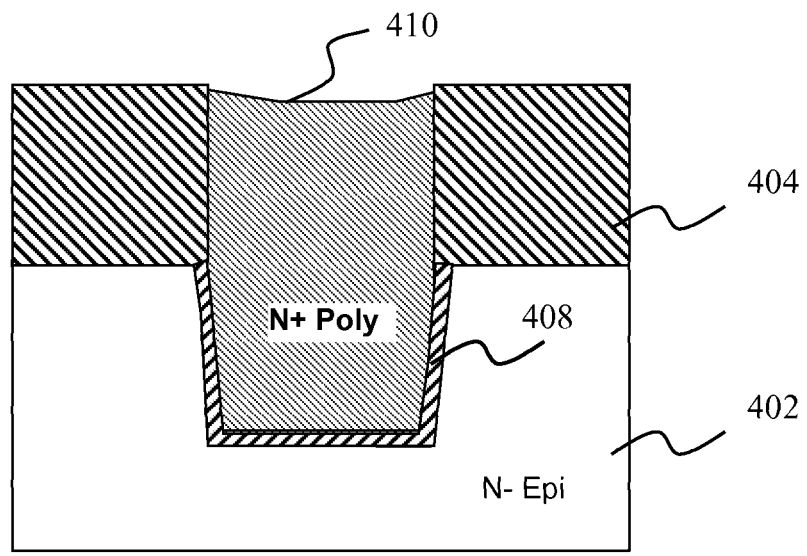
Figure 4D:
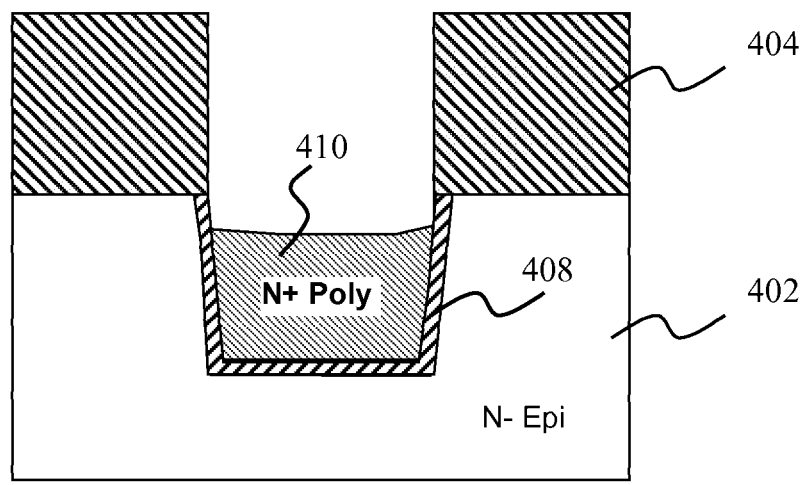

As shown in FIG. 4B, a trench 406 is then formed by reactive ion etching (RIE) the N-epi silicon layer through the trench mask 404 to a predetermined depth. Etched polymer may then be stripped and wafer cleaned at this point. As shown in FIG. 4C, a thin gate oxide 408 is formed on the sidewall and bottom of the trench 406, e.g., using thermal oxidation, following standard sacrificial oxidation and sacrificial oxide removal. A conductive material, such as N+ doped polysilicon, is deposited into the remaining space in the trench 406 and etched back using standard techniques, until the oxide surfaces on top of region 402, are exposed. The conductive material in the trench 406 is then further etched back to a level below the top surface of the N-epi layer 402 as shown in FIG. 4D.

Figure 4E:
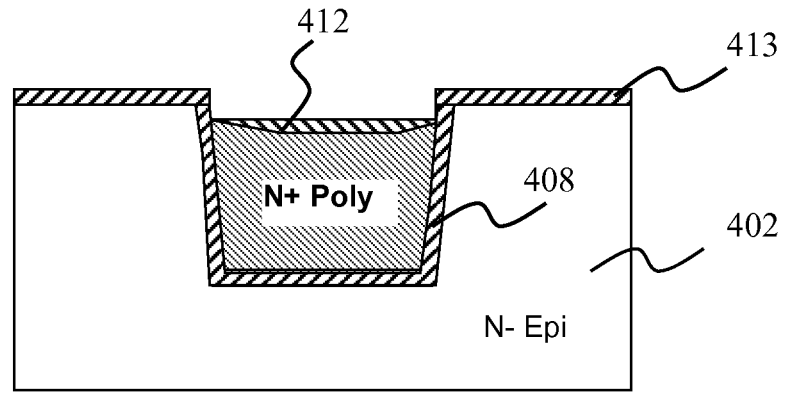
Figure 4F:
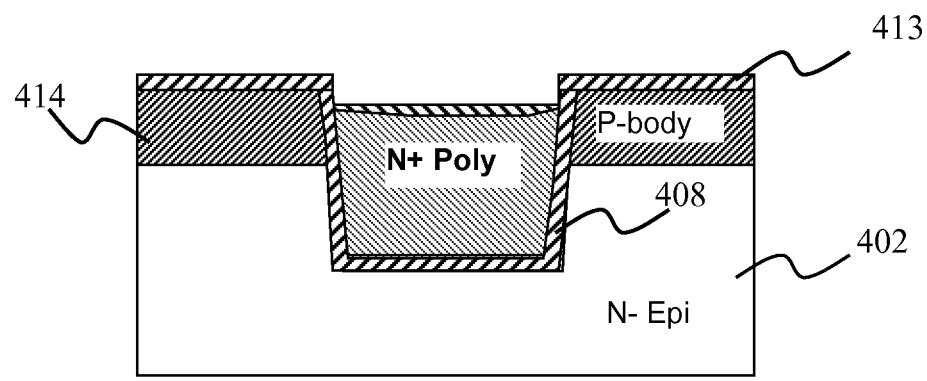
Figure 4G:
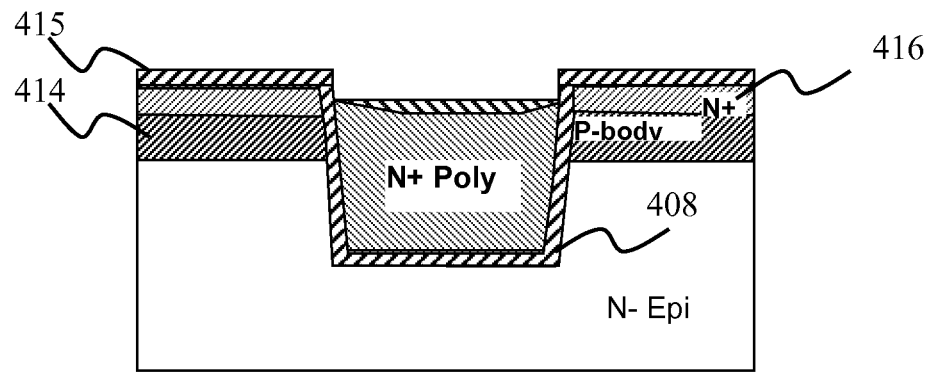

As shown in FIG. 4E, the trench mask 404 is stripped away and an oxide 412 is formed on top of the gate electrode, and an oxide 413 is formed over any exposed silicon surfaces. The two oxides are not identical even though they are formed at the same step, because of the differences in doping concentration of the two regions. A body region 414 is formed by ion implantation (e.g., Boron ions at an energy of 20 to 100 KeV, and a dose of $3\times10^{12}$ to $1\times10^{14}$) and diffusion (e.g., at 950 C to 1100 C) in the top portion of the N-epi layer 402 as shown in FIG. 4F. Then, N-type dopants are blanket implanted (shallow arsenic implant for example, dose of $2\times10^{15}$ to $5\times10^{15}$, energy of 40 to 80 KeV) and diffused (e.g., at 850 C to 1000 C) in a top region of the P-Body region 414, thereby forming a shallow N+ source layer 416 as shown in FIG. 4G.

Figure 4H:
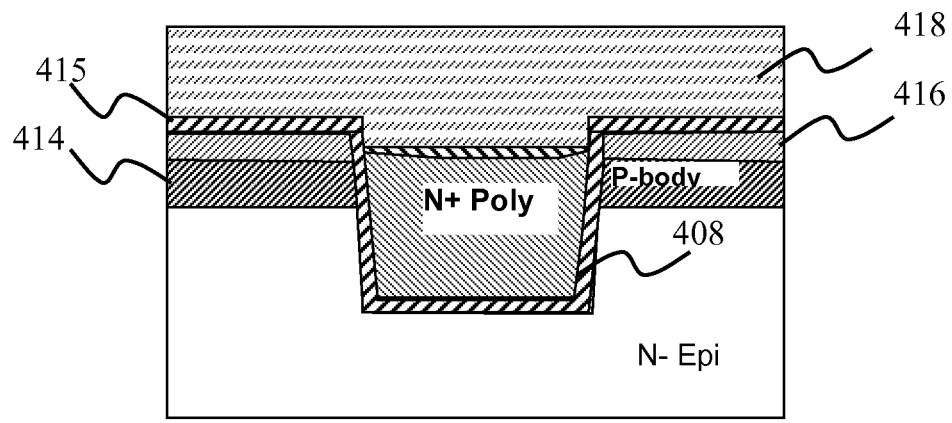

An oxide 418, such as boro-phospho-silicate glass (BPSG), is formed on top of the gate 410 and the source regions 416 following with the densification and reflow (e.g., at 800 to 900 C) as shown in FIG. 4H.

Figure 4I:
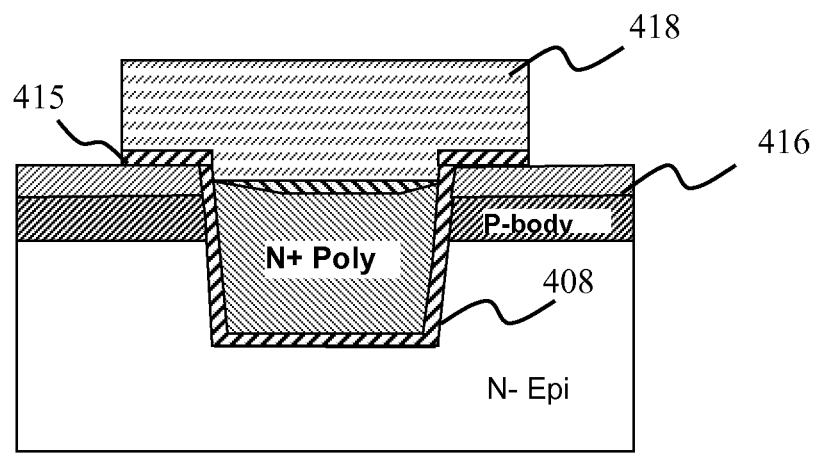
Figure 4J:
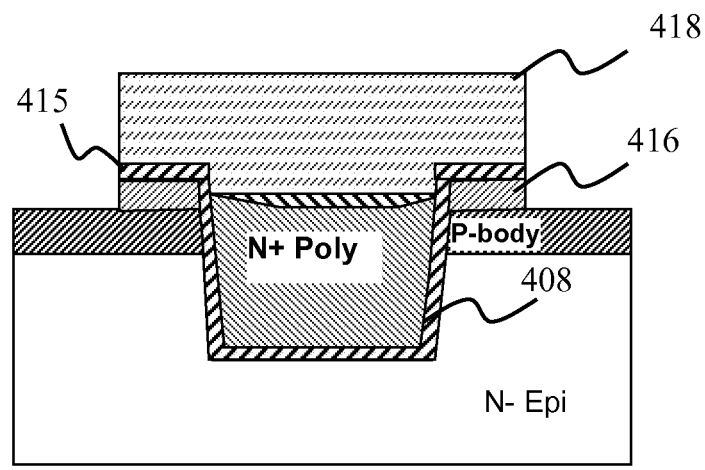

A portion of the oxide 418 and the mask 415 are dielectric etched using a contact mask, to expose selected portions of the source regions 416 as shown in FIG. 4I. The selected portions of the source silicon regions not covered by the oxide 418 are then etched down to remove the exposed N+ source region, down to the P-body layer 414 as shown in FIG. 4J. Optionally, a portion at the top surface not covered by the oxide 418, is also etched to a level below that of a bottom surface of the source region 416, which is described in FIG. 5B below in an alternative method of fabrication of trench MOSFET devices of the types depicted in FIGS. 1C-1D.

Figure 4K:
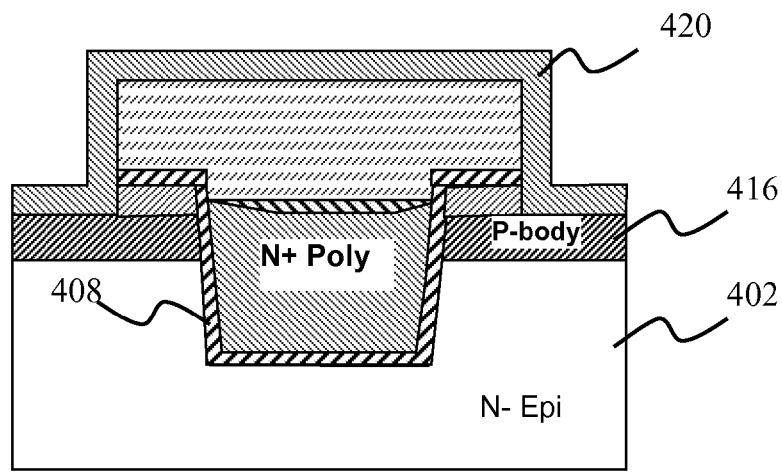

An N+ doped polysilicon layer 420 is deposited on top and sidewall of the remaining portions of the source region 416 and on top of the P-body layer 414 and the oxide 418 as shown in FIG. 4K. The thin polysilicon layer (e.g., about 300 A to 2000 A) can be in-situ doped N-type during deposition, or ion-implanted after deposition using either Arsenic or Phosphorus (at a dose of $1\times10^{15}$ to $5\times10^{15}$, energy 20 KeV to 60

Figure 4L:
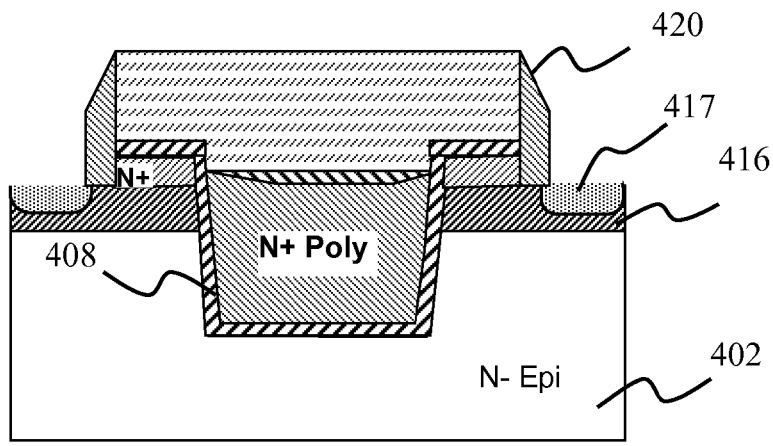

KeV), if the Polysilicon layer was deposited undoped. The N+ doped polysilicon layer 420 is the etched back to form N+ doped polysilicon spacer 420 disposed only on the sidewalls of the source regions 416 and the oxide 418 as shown in FIG. 4L. At this point, a high-dose low-energy body contact ion implant step (Boron or $BF_2$, $5 \times 10^{14}$ to $2 \times 10^{15}$ dose, energy of 10 KeV to 60 KeV) followed by a short rapid thermal anneal (850 C to 1000 C, 10 to 60 seconds) can be performed to reduce the contact resistance of the resulting exposed body contact region 417. The doping of this region simply has to be lower than that of the N+ polysilicon spacer layer.

Figure 4M:
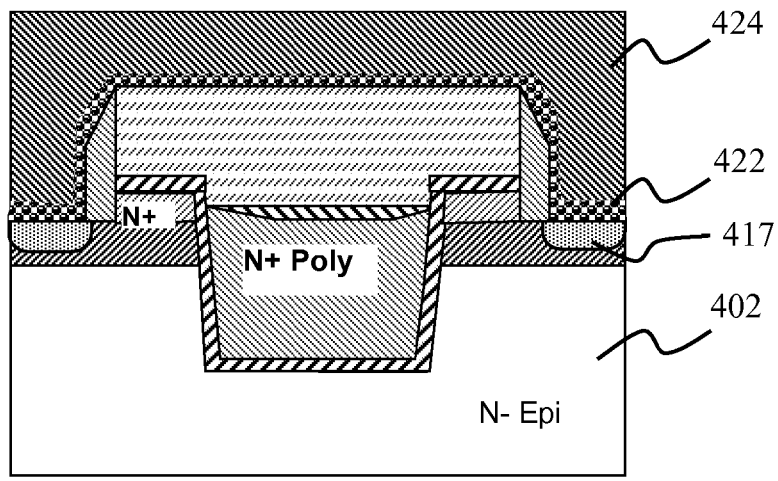

As shown in FIG. 4M, the semiconductor device is completed by depositing a barrier metal 422 (such as Ti, TiN, Ti/TiN, TiW, TiWN, thickness in the 200 A to 1500 A range) on top of the P-body layer 414, the N+ doped polysilicon spacer 420 and the oxide 418 followed by the deposition and patterning of a top metal layer (thick aluminum, or AlCu alloy, 0.5 to 4 microns thick for example) 424. The wafers are then passivated, e.g., with a layer of oxide, nitride, or oxynitride, which is not shown in FIG. 4M.

Figure 5A:
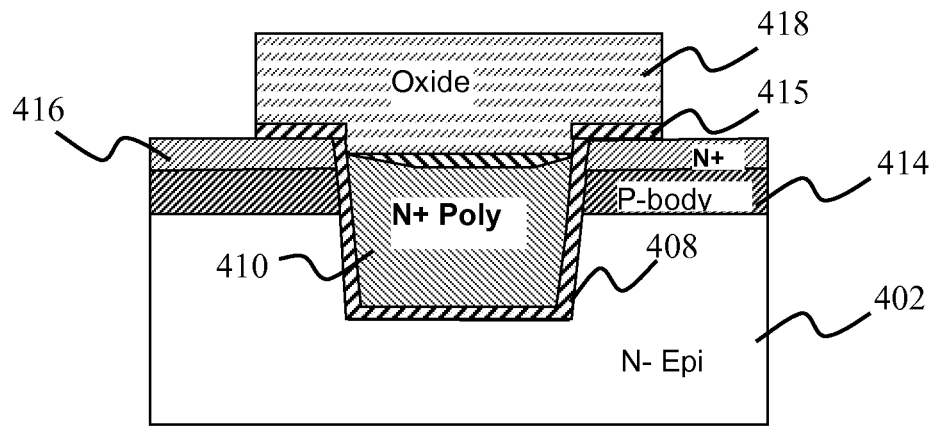
FIGS. 5A-5E are cross-sectional views illustrating a method for manufacturing the MOSFETs of the types depicted in FIGS. 1C-1D.
Figure 5B:
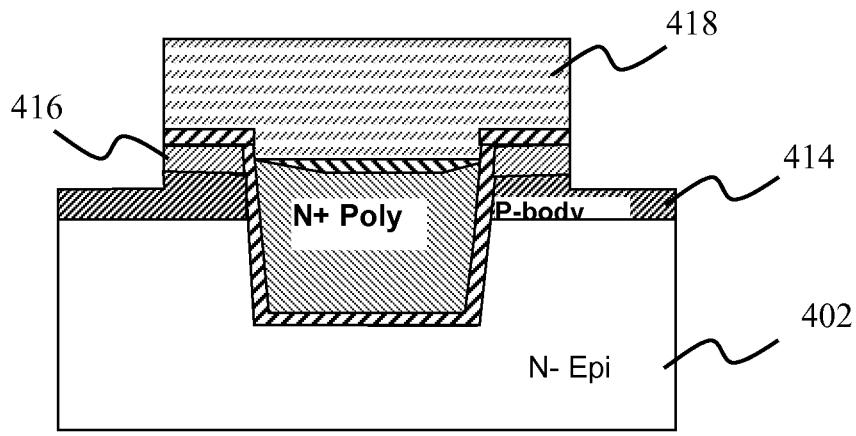

FIGS. 5A-5E are cross-sectional views illustrating an alternative method of fabrication of a trench MOSFET of the types depicted in FIGS. 1C-1D. FIG. 5A is the same as FIG. 4I as described above. The process described with respect to FIGS. 4A-4I may be used to produce the structure shown in FIG. 5A. The selected portions of the source regions not covered by the oxide 418 are then etched down to the P-body layer 414 and a portion at the top surface of the P-body layer 414 not covered by the oxide 418 is also etched to a level slightly below that of a bottom surface of the source region 416 as shown in FIG. 5B.

Figure 5C:
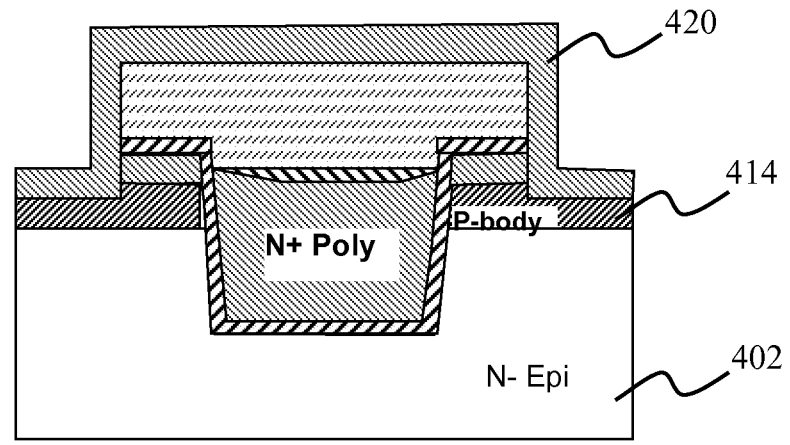
Figure 5D:
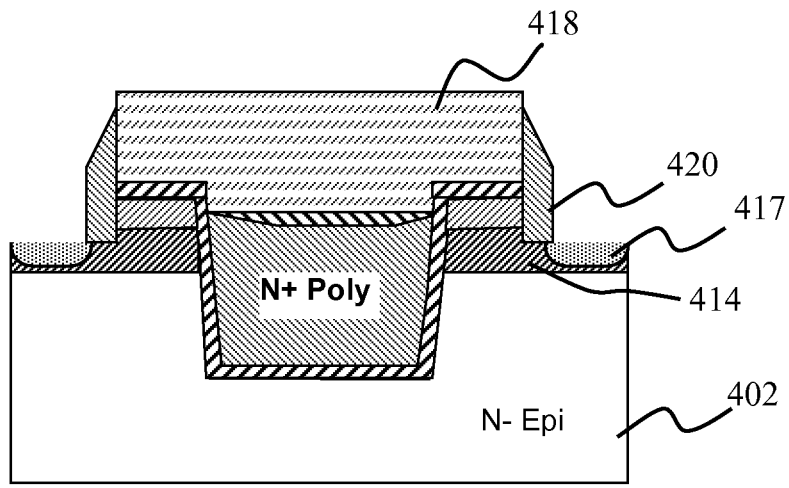
Figure 5E:
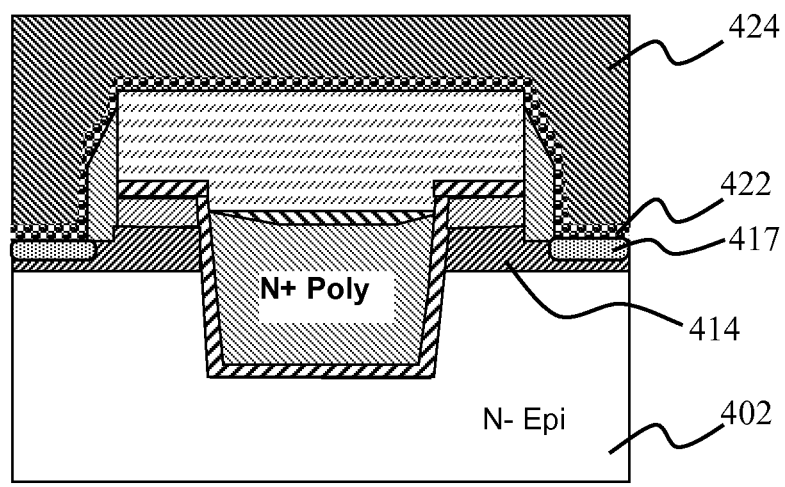

An N+ doped polysilicon layer 420 is deposited on top and sidewall of the remaining portions of the source region 416 and on top of the P-body layer 414 and the oxide 418 as shown in FIG. 5C. This polysilicon layer 420 can be deposited in-situ N+ doped, or it can be implanted with arsenic or phosphorus, if it was deposited undoped. The N+ doped polysilicon layer 420 is the etched back to form N+ doped polysilicon spacer 420 disposed only on the sidewall of the source region 416 and the oxide 418 as shown in FIG. 5D. In addition, after etch-back of the polysilicon, heavily P-doped contact regions 417 may be implanted into the P-body layer 414 proximate the N+ polysilicon spacers 420 but spaced away from the source region 416. As shown in FIG. 5E, the semiconductor device may be completed by depositing a barrier metal 422 on top of the P-body layer 414, the N+ doped polysilicon spacer 420 and the oxide 418 followed by deposition and patterning of a thick metal 424 and a passivation layer, which is not shown in FIG. 5E.

Figure 6A:
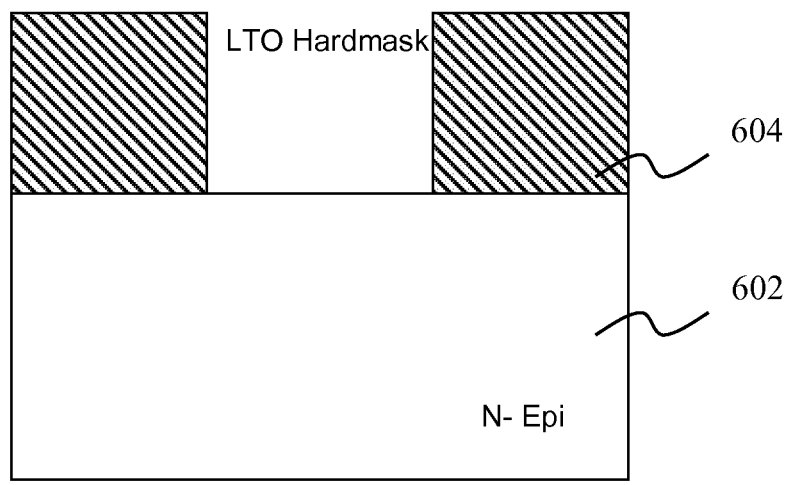
FIGS. 6A-6M are cross-sectional views illustrating a method for manufacturing the MOSFETs of the types depicted in FIG. 1E.

FIGS. 6A-6M are cross-sectional views illustrating a method of fabrication of a trench MOSFET of the type depicted in FIG. 1E. This embodiment features a lightly doped source ballasting region which improves the reliability under certain applications. As shown in FIG. 6A, an N-type epitaxial semiconductor layer 602 may be grown on a highly doped substrate 609. A trench mask 604 is then formed on a surface of the N-epi layer 602, e.g., by patterning a photoresist layer, or, optionally patterning a hardmask oxide formed by a low temperature oxide (LTO) deposition technique or thermal oxidation, defined by a photoresist masking step followed by an oxide etch step.

Figure 6B:
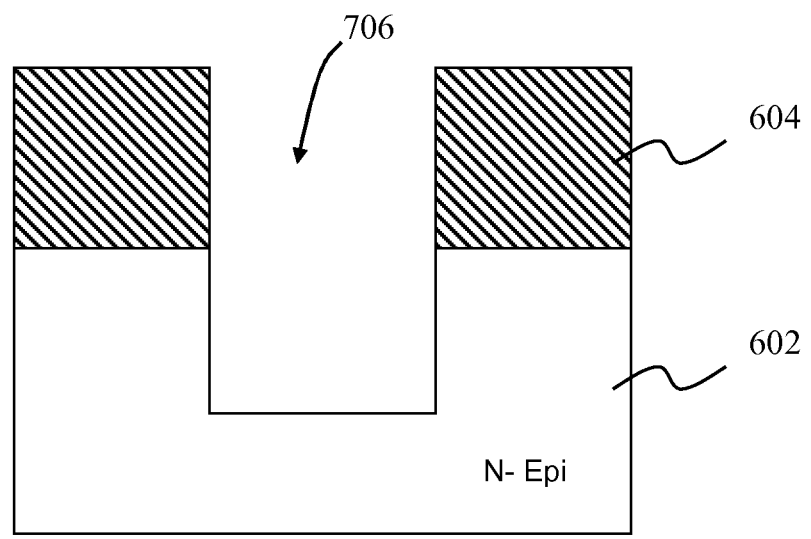
Figure 6C:
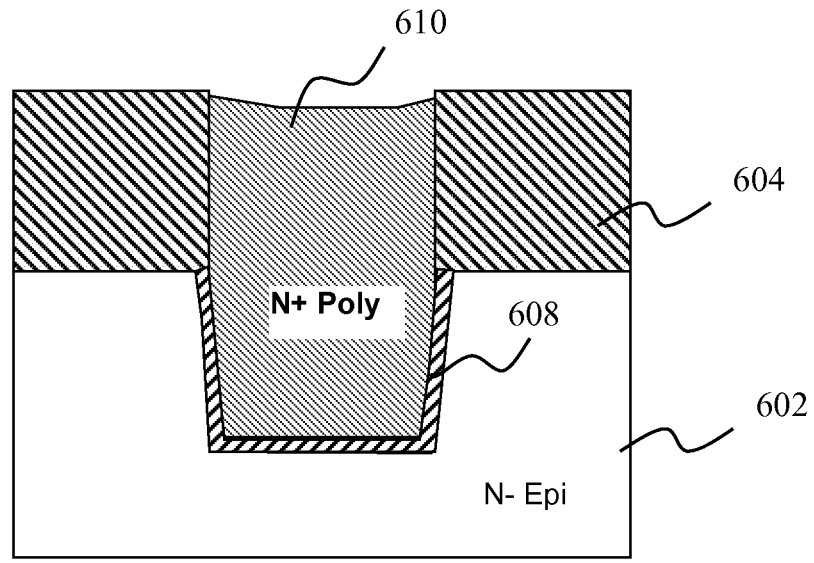
Figure 6D:
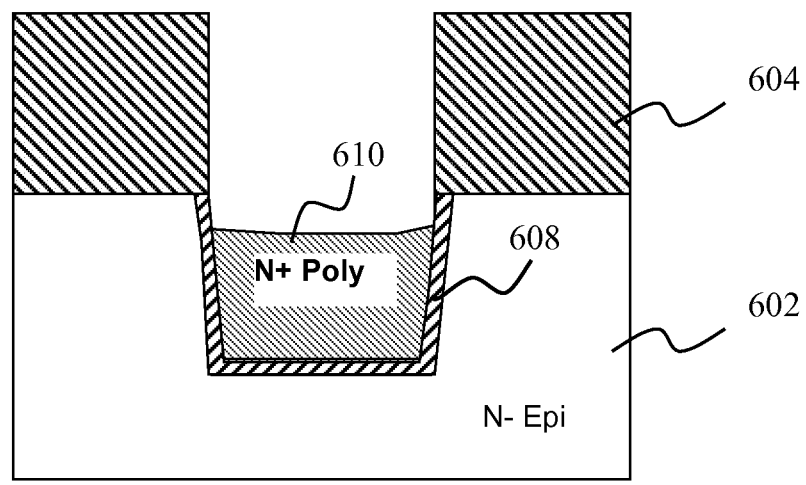

As shown in FIG. 6B, a trench 606 is then formed by reactive ion etching (RIE) the N-epi layer through the trench mask 604 to a predetermined depth. Etched polymer may then be stripped and wafer cleaned at this point. As shown in FIG. 6C, a thin gate oxide 608 is formed on the sidewall of the trench 606 following a standard sacrificial oxidation growth and strip process. A conductive material, such as N+ polysilicon, is deposited into the remaining space in the trench 606 to form a standard poly stick up gate 610. The conductive material in the trench 606 is then etched back to expose the top of the oxide 604 as shown in FIG. 6C. The N+ gate electrode material is then further etched-back to a level below the top surface of the N-epi layer 602 as shown in FIG. 6D.

Figure 6E:
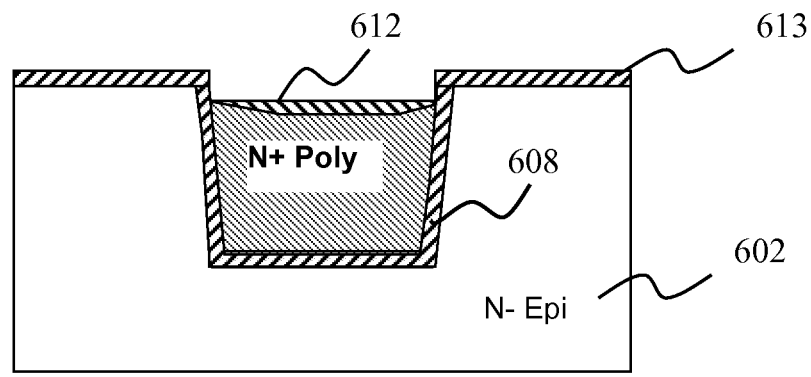
Figure 6F:
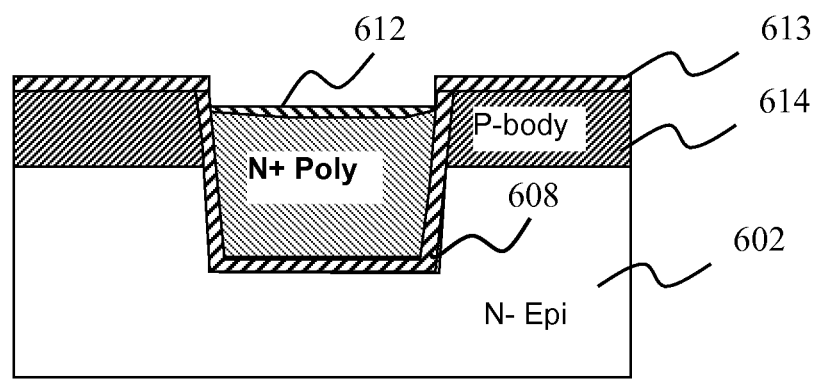
Figure 6G:
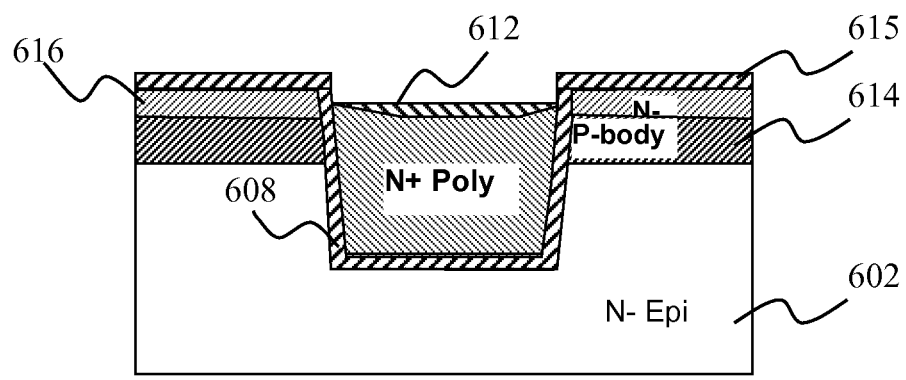

As shown in FIG. 6E, the trench mask 604 (oxide) is stripped off and an oxide 612 is formed on top of the gate electrode 610 and and oxide 613 is formed over the exposed silicon. A body region 614 is then formed in the top region of N-epi layer 602, e.g., using ion implantation and diffusion, as shown in FIG. 6F. Then, N-type dopants are blanket implanted (phosphorus for example, at a dose of $1 \times 10^{12}$ to $5 \times 10^{14}$, energy of 20 to 80 KeV) and diffused (900 C to 1050 C) in a top region of P-body region 614, thereby forming low doped N− source layer 616 as shown in FIG. 6G.

Figure 6H:
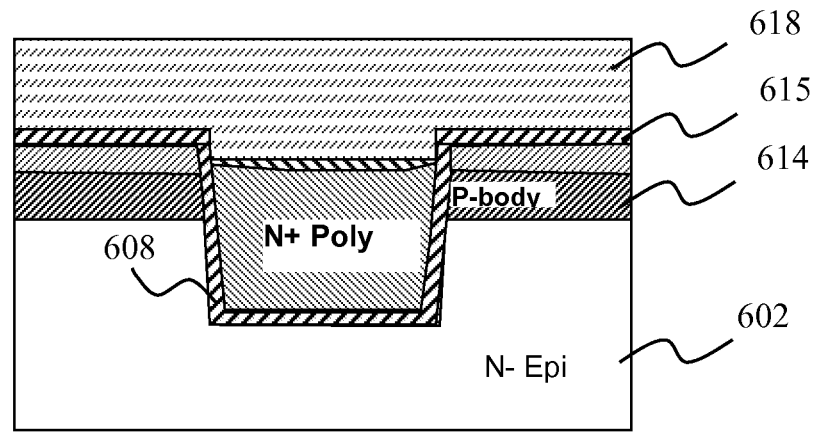
Figure 6I:
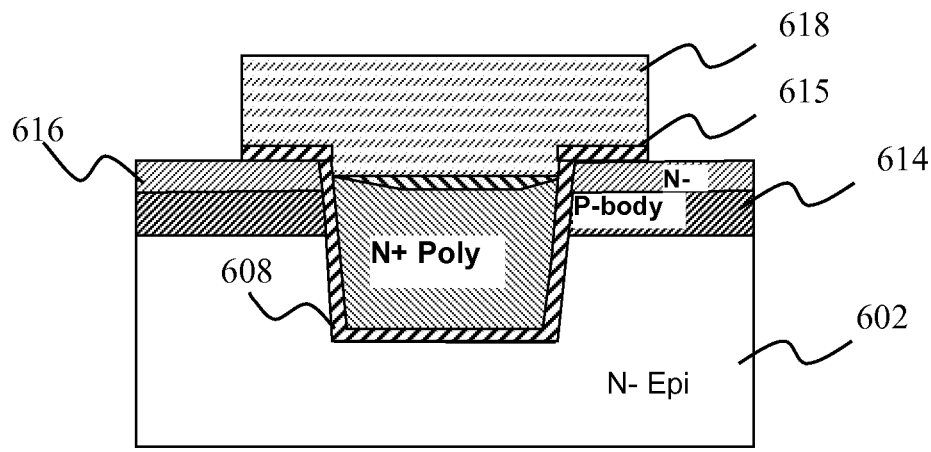
Figure 6J:
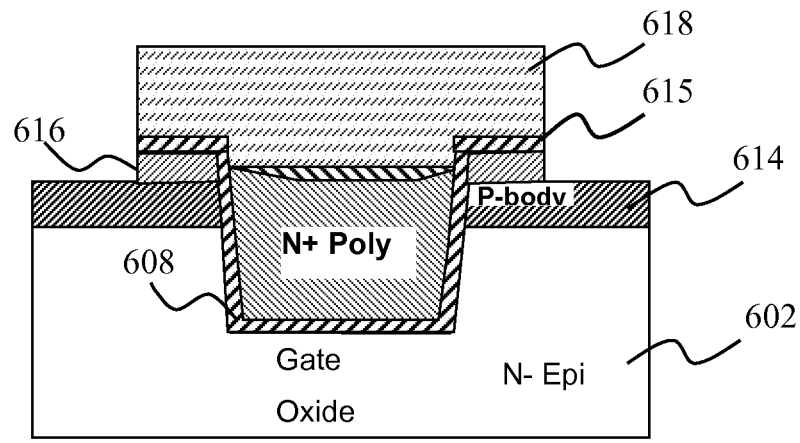

An oxide 618, such as boro-phospho-silicate glass, is formed on top of the gate 610 and the low-doped N− source regions 616 followed by a densification and reflow as shown in FIG. 6H. A portion of the oxide 618 is etched using a contact mask (not shown) such that a portion of the low-doped N− source regions 616 are exposed, as shown in FIG. 6I. The selected portions of the source silicon regions not covered by the oxide 618 are then etched down to the P-body layer 614 as shown in FIG. 6J. Optionally, a portion at the top surface of the P-body layer not covered by the oxide 618 is also etched to a level below that of a bottom surface of the source region 616.

Figure 6K:
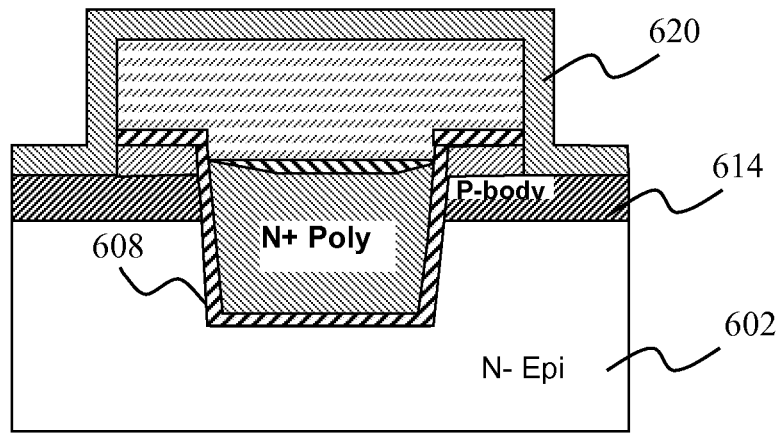
Figure 6L:
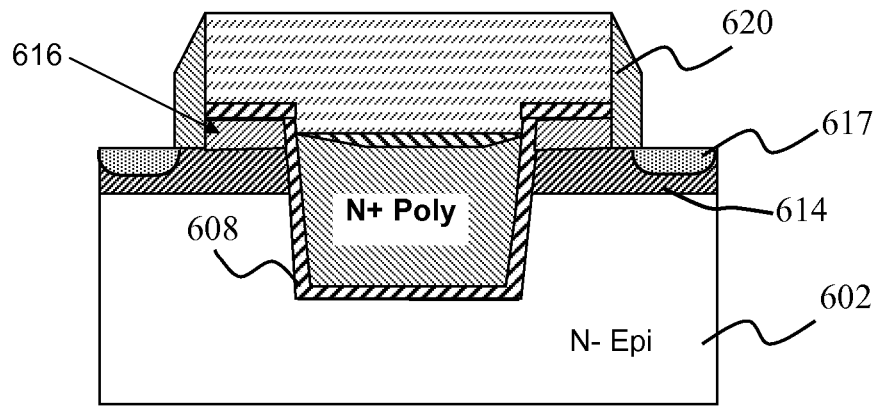
Figure 6M:
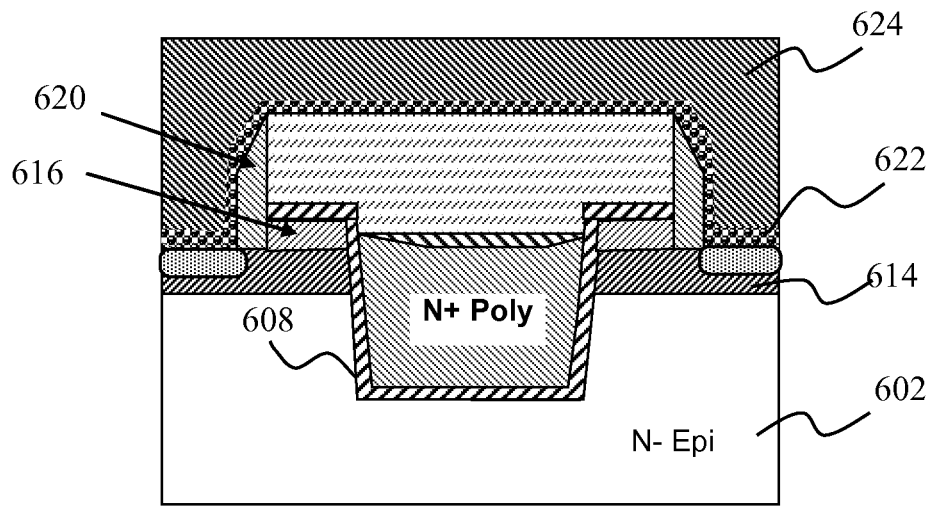

An N+ doped polysilicon layer 620 is deposited on top and sidewall of the remaining portions of the source region 616 and on top of the P-body layer 614 and the oxide 618 as shown in FIG. 6K. The Polysilicon can be deposited in-situ N+ doped (for N-channel) or implanted N type (shallow Arsenic or phosphorus for example) if the polysilicon is deposited undoped. The N+ doped polysilicon layer 620 is the etched back to form N+ doped polysilicon spacer 620 disposed only on the sidewall of the low-doped N-source region 616 and the oxide 618 as shown in FIG. 6L. In addition, after etch-back of the polysilicon, heavily P-doped contact regions 617 may be implanted into the P-body layer 614 proximate the N+ polysilicon spacers 620 but spaced away from the source region 616. As shown in FIG. 6M, the semiconductor device is completed by depositing a barrier metal 622 on top of the P-body layer 614, the N+ doped polysilicon spacer 620 and the oxide 618 followed by thick metal deposition and patterning 624, and passivation (not shown in FIG. 6M).

Embodiments of the present invention allow for the fabrication of N-channel or P-channel devices with low contact resistance and parasitic bipolar action. It is noted that although the foregoing examples relate to N-channel devices and their fabrication, those of skill in the art will recognize that the same teachings may be applied to P-channel devices and their fabrication. Since semiconductor materials of opposite polarity (e.g., P-type and N-type) differ primarily in the polarity of the dopants used, the above teachings may be applied to P-channel devices by reversing the polarity of the semiconductor layers and dopants discussed above.

While the above is a complete description of the preferred embodiment of the present invention, it is possible to use various alternatives, modifications and equivalents. Therefore, the scope of the present invention should be determined not with reference to the above description but should, instead, be determined with reference to the appended claims, along with their full scope of equivalents. Any feature, whether preferred or not, may be combined with any other feature, whether preferred or not. In the claims that follow, the indefinite article "A", or "An" refers to a quantity of one or more of the item following the article, except where expressly stated otherwise. The appended claims are not to be interpreted as including means-plus-function limitations, unless such a limitation is explicitly recited in a given claim using the phrase "means for."

What is claimed is:

1. A semiconductor device comprising:
a body region formed in an epitaxial layer;
a gate electrode formed in a trench in the body region and epitaxial layer;
a source region disposed on the body region next to the gate electrode;
a gate oxide disposed between the gate electrode and the source region, the body region and the epitaxial layer;
a drain region formed by a substrate disposed below a bottom of the gate electrode and below the body region;
an oxide disposed on top of the gate electrode and extending over a top portion of the source region;
a doped polysilicon spacer disposed along a sidewall of the source region and a sidewall of the oxide;
an exposed body contact region in an upper portion of the body region, adjacent to the doped polysilicon spacer, wherein the exposed body contact region has a top surface which is recessed below the bottom surface of the source region and spaced away from the source region by the doped Polysilicon spacer; and
a source metal layer disposed on the device such that the doped polysilicon spacer is in electrical contact with the source region and the source metal layer.

2. The semiconductor device of claim 1, wherein a portion of a top surface of the body region not underlying the source region is recessed to a lower level than a portion of the top surface of the body region underlying the source region.

3. The semiconductor device of claim 1, wherein the doped polysilicon spacer extends to a top portion of the source region.

4. The semiconductor device of claim 1, wherein the semiconductor device is an N-channel device.

* * * * *